(12) United States Patent
Chen et al.

(10) Patent No.: US 9,640,249 B2
(45) Date of Patent: May 2, 2017

(54) WRITE ASSIST SCHEME FOR LOW POWER SRAM

(71) Applicant: Nvidia Corporation, Santa Clara, CA (US)

(72) Inventors: Gang Chen, Shanghai (CN); Jing Guo, Shanghai (CN); Jun Yang, Shanghai (CN)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/282,809

(22) Filed: May 20, 2014

(65) Prior Publication Data

US 2015/0235695 A1    Aug. 20, 2015

(30) Foreign Application Priority Data

Feb. 18, 2014  (CN) .......................... 2014 1 0054989

(51) Int. Cl.
*G11C 11/00* (2006.01)
*G11C 11/419* (2006.01)
*G11C 5/14* (2006.01)

(52) U.S. Cl.
CPC ............ *G11C 11/419* (2013.01); *G11C 5/147* (2013.01)

(58) Field of Classification Search
None
See application file for complete search history.

(56) References Cited

U.S. PATENT DOCUMENTS

| | | | |
|---|---|---|---|
| 7,498,836 B1* | 3/2009 | Tuan | 326/38 |
| 2006/0056229 A1* | 3/2006 | Maeda | G11C 5/063 |
| | | | 365/154 |
| 2006/0262628 A1* | 11/2006 | Nii | G11C 5/063 |
| | | | 365/226 |
| 2011/0261609 A1* | 10/2011 | Seshadri | G11C 11/417 |
| | | | 365/154 |
| 2013/0141963 A1* | 6/2013 | Liaw | 365/156 |
| 2014/0003132 A1* | 1/2014 | Kulkarni et al. | 365/154 |
| 2014/0169077 A1* | 6/2014 | Kolar et al. | 365/156 |
| 2015/0036418 A1* | 2/2015 | Chai et al. | 365/154 |

* cited by examiner

*Primary Examiner* — Kretelia Graham

(57) ABSTRACT

A write-assist memory includes a memory supply voltage and a column of SRAM cells that is controlled by a pair of bit lines, during a write operation. Additionally, the write-assist memory includes a write-assist unit that is coupled to the memory supply voltage and the column of SRAM cells and has a separable conductive line located between the pair of bit lines that provides a collapsible SRAM supply voltage to the column of SRAM cells based on a capacitive coupling of a control signal in the pair of bit lines, during the write operation. A method of operating a write-assist memory is also provided.

19 Claims, 5 Drawing Sheets

Fig. 4 operation timing of new write assist scheme

WRITE ASSIST SCHEME FOR LOW POWER SRAM

CROSS-REFERENCE TO RELATED APPLICATION

This application claims priority to Chinese Application No. 201410054989.4 filed on Feb. 18, 2014, which is incorporated herein by reference.

TECHNICAL FIELD

This application is directed, in general, to a semiconductor memory and, more specifically, to a write-assist memory and a method of operating a write-assist memory.

BACKGROUND

As technology advances, SRAM core voltage reduction has lagged behind logic voltage, and has become a limiting bottleneck for improvement in semiconductor chip power consumption. A major limiting factor is that the minimum voltage (Vmin) of an SRAM write voltage cannot be scaled down aggressively due to increased threshold voltage variations and increased SRAM capacity requirements as the device size decreases. To resolve this issue, write assist circuits have become a main focus of interest to allow further reduction of the minimum voltage (Vmin) without write failure. Write failure usually occurs when a pass gate transistor cannot overpower a corresponding pull up transistor in an SRAM cell. Improvements in this area would be beneficial to the art.

SUMMARY

Embodiments of the present disclosure provide a write-assist memory and a method of operating a write-assist memory.

In one embodiment, the write-assist memory includes a memory supply voltage and a column of SRAM cells that is controlled by a pair of bit lines, during a write operation. Additionally, the write-assist memory includes a write-assist unit that is coupled to the memory supply voltage and the column of SRAM cells and has a separable conductive line located between the pair of bit lines that provides a collapsible SRAM supply voltage to the column of SRAM cells based on a capacitive coupling of a control signal in the pair of bit lines, during the write operation.

In another aspect, the method of operating a write-assist memory includes providing a memory supply voltage and controlling a write operation in a column of SRAM cells through a pair of bit lines. The method also includes separating an SRAM supply voltage to the column of SRAM cells from the memory supply voltage and reducing the SRAM supply voltage based on a capacitive coupling of a control signal in the pair of bit lines, during the write operation.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure provide a novel memory write-assist approach that conserves memory layout area and performs by using existing memory control signals.

Figure 1:
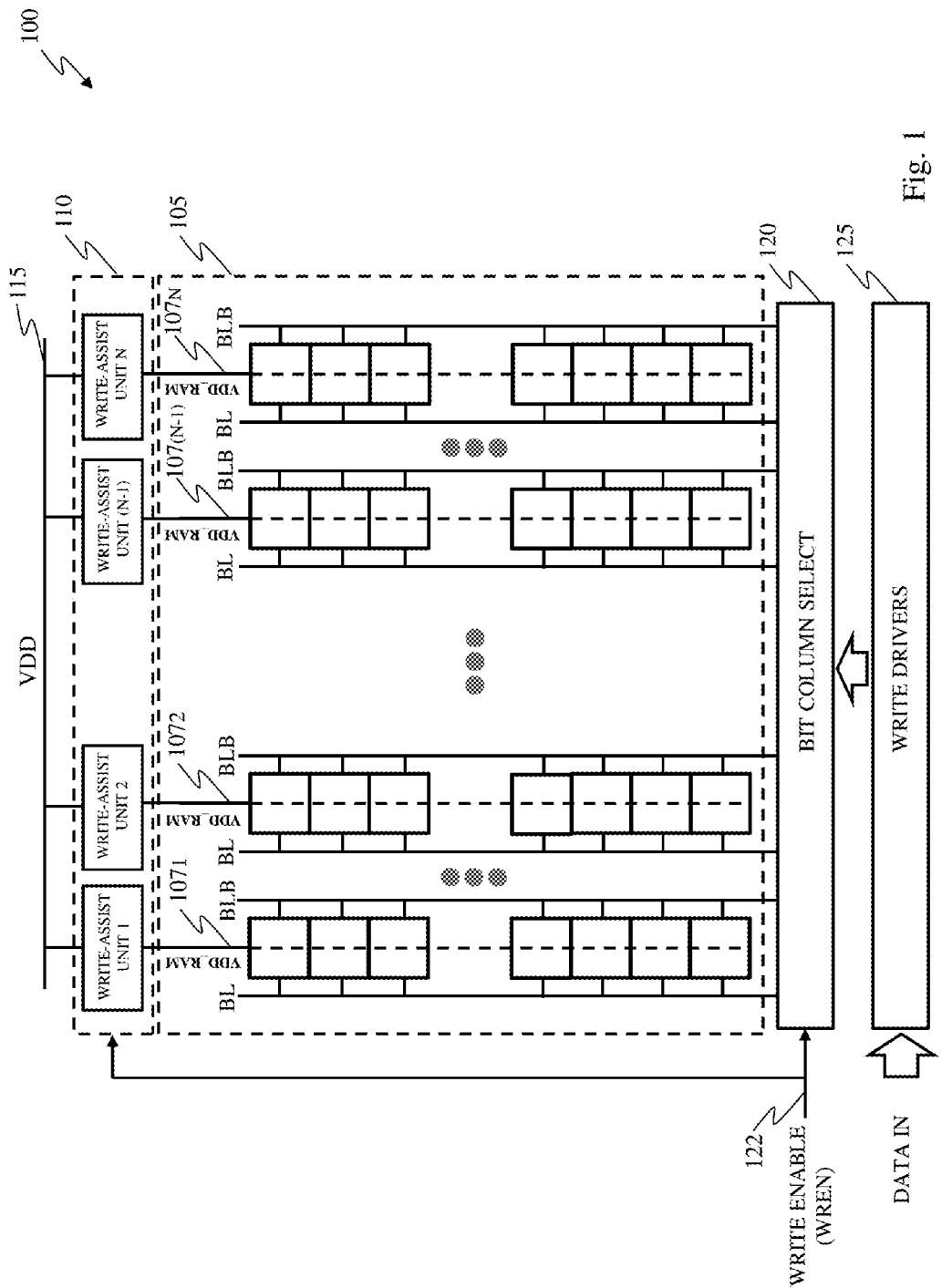
FIG. 1 illustrates an embodiment of a portion of a memory system constructed according to the principles of the present disclosure.

FIG. 1 illustrates an embodiment of a portion of a memory system, generally designated 100, constructed according to the principles of the present disclosure. The memory system portion 100 includes an SRAM array 105, write-assist units 110, a memory supply voltage (VDD) 115, a bit column select 120 and write drivers 125.

The SRAM array 105 includes a group of SRAM cells wherein each SRAM cell stores one bit of data. The group of SRAM cells is arranged horizontally into rows corresponding to a number of bits per word of the SRAM array 105 and vertically corresponding to a total number of words contained in the SRAM array 105. The vertical arrangement of the SRAM array 105 includes SRAM cell columns wherein each SRAM cell column includes a pair of complementary bit lines BL, BLB that are controlled by the bit column select 120 employing a write enable control signal (WREN) 122, and the write drivers 125 providing input data, as shown. All of the bit line pairs are precharged to a TRUE condition before a word line (not specifically shown in FIG. 1) is enabled to allow writing into a word row after the word line is enabled (i.e., during a write operation).

Each of the write-assist units 110 corresponds to one of the SRAM cell columns and is controlled by the write enable control signal (WREN) 122, as well. That is, a first write-assist unit 1 is connected to a first SRAM cell column by a separable conductive line $107_1$. Correspondingly, each remaining write-assist unit (2-N) is respectively connected to a remaining SRAM cell column by separable conductive lines $107_2$-$107_N$, as shown.

Additionally, each of the write-assist units (1-N) is coupled to the memory supply voltage (VDD) 115 as well as its column of SRAM cells through its individual separable conductive line. Each separable conductive line is also physically located between its corresponding pair of bit lines BL, BLB to provide a collapsible SRAM supply voltage VDD_RAM to its column of SRAM cells, which is based on a capacitive coupling of a control signal in its pair of bit lines BL, BLB, during the write operation.

Figure 2:
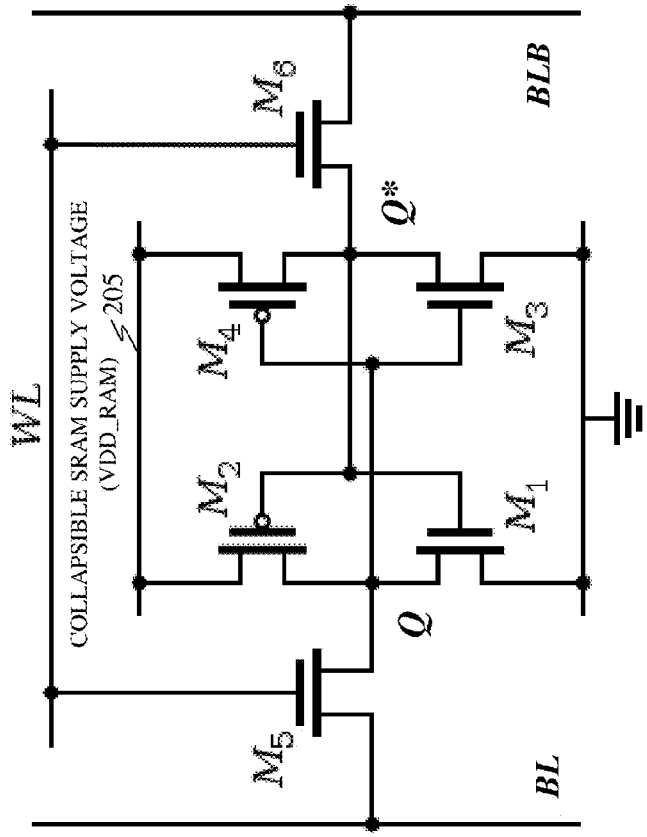
FIG. 2 illustrates a schematic of an SRAM cell as may be employed in the memory system portion of FIG. 1.

FIG. 2 illustrates a schematic of an SRAM cell, generally designated 200, as may be employed in the memory system portion 100 of FIG. 1. The SRAM cell 200 includes a pair of cross-coupled CMOS inverters M1:M2 and M3:M4 that provide a memory cell having complementary storage nodes Q and Q*, as shown. The SRAM cell 200 also includes corresponding first and second pass gate transistors M5 and M6 that are respectively connected between a bit line BL and the storage node Q and a complementary bit line BLB and the complementary storage node Q*. The first and second pass gate transistors M5 and M6 are controlled by a word line WL, and the cross-coupled CMOS inverters M1:M2 and M3:M4 are powered by a collapsible SRAM supply voltage (VDD_RAM) 205.

In the illustrated embodiment, the collapsible SRAM supply voltage VDD_RAM is reduced from an initial voltage, which is equal to a memory supply voltage (VDD) (as shown in FIG. 1). This voltage reduction occurs during a write operation (when the word line WL is activated) and is based on a capacitive coupling of a control signal (e.g., a decreasing bit line voltage) from the appropriate bit line (BL or BLB). This voltage reduction event facilitates writing into the SRAM cell 200 through a lowering (i.e., weakening) of its supply voltage, thereby enhancing the write operation for the SRAM cell 200.

This capacitive coupling employs distributed capacitances between a separable conductive line, which provides the collapsible SRAM supply voltage VDD_RAM, and each of the bit lines BL and BLB. The separable conductive line is substantially centrally located between the bit lines BL and BLB to provide an equal influence from each of the bit lines. These distributed capacitances are typically fringing capacitances that provide increased coupling due to an ongoing shrinking of dimensions for SRAM arrays or memories. Additionally, this write-assist approach is scalable (i.e., adaptable) to varying sizes of SRAM arrays or memories (e.g., compiler applications).

Figure 3:
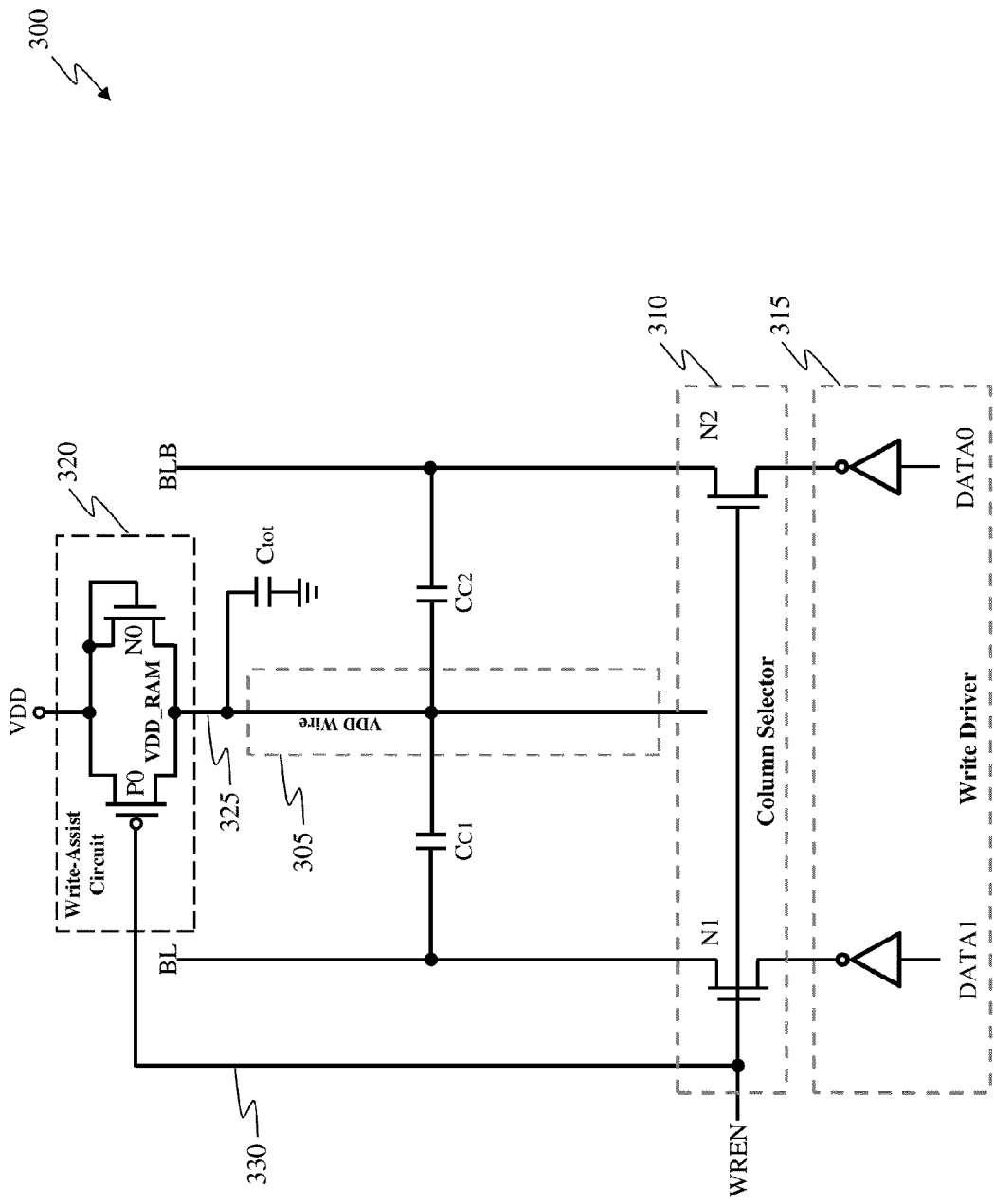
FIG. 3 illustrates an expanded diagram of a column structure as may be employed in the memory system portion of FIG. 1.

FIG. 3 illustrates an expanded diagram of a column structure, generally designated 300, as may be employed in the memory system portion 100 of FIG. 1. The column structure 300 includes a column of SRAM cells 305, a pair of complementary bit lines BL and BLB, a column selector 310, write drivers 315, a write-assist circuit 320, a separable conductive line (VDD wire) 325, a write-assist control line 330, first and second coupling capacitances $C_{C1}$, $C_{C2}$ and a total ground capacitance $C_{tot}$.

The column of SRAM cells 305 is representative of SRAM cell columns in an SRAM array such as the SRAM array 105 discussed with respect to FIG. 1. The pair of complementary bit lines BL, BLB provides bit line control of the column of SRAM cells 305 and is enabled by the column selector 310, which is controlled by a write enable control signal WREN, and the write drivers 315. The pair of complementary bit lines BL, BLB in this embodiment is precharged to a positive voltage before starting a write operation. Then during the write operation, one of the pair of complementary bit lines BL, BLB is driven to ground potential to write into a selected SRAM cell in the column of SRAM cells 305.

The column selector 310 includes first and second bit line switches N1, N2 that provide connection of the pair of complementary bit lines BL, BLB to the write driver 315. The write driver 315 includes a DATA1 inverter and a DATA0 inverter respectively connected to the first and second bit line switches N1, N2 to drive one of the complementary bit lines BL, BLB to ground potential during a write operation.

The write-assist circuit 320 includes a transistor switch P0 and a diode-connected transistor N0. The write-assist circuit 320 is connected to a memory supply voltage VDD through activation of the transistor switch P0 when a write operation is not being performed for the column of SRAM cells 305. Correspondingly, the transistor switch P0 is deactivated during the write operation of the column of SRAM cells 305 thereby providing a collapsible SRAM supply voltage VDD_RAM through the separable conductive line (VDD wire) 325 to the column of SRAM cells 305.

The write-assist control line 330 allows the write enable control signal WREN to determine if the separable conductive line (VDD wire) 325 is connected to the memory supply voltage VDD or is alternatively disconnected from the memory supply voltage VDD during the write operation.

This disconnection during the write operation allows a magnitude of the collapsible SRAM supply voltage VDD_RAM on the separable conductive line (VDD wire) 325 to be controlled by an appropriate one of the pair of bit lines (BL or BLB) through one of the first and second coupling capacitances $C_{C1}$, $C_{C2}$. The magnitude of the collapsible SRAM supply voltage VDD_RAM is determined by sizes of the first and second coupling capacitances $C_{C1}$, $C_{C2}$ and the total ground capacitance $C_{tot}$ associated with the separable conductive line (VDD wire) 325. A voltage difference ΔV (i.e., an amount of voltage drop) from an initial voltage VDD on the separable conductive line (VDD wire) 325 is expressed below.

$$\Delta V = VDD - VDD\_RAM = \frac{C_C}{C_{tot} + 2C_C} VDD, \quad (1)$$

where the first and second coupling capacitances $C_{C1}$, $C_{C2}$ are equal and are each represented by the term $C_C$.

This amount of voltage drop ΔV decreases the cell supply voltage (VDD_RAM) of the column of SRAM cells 305 and thereby weakens the pull up transistor (e.g., $M_2$ or $M_4$ of FIG. 2) on the side of an SRAM cell being written into, which facilitates a state change of the SRAM cell during the write operation. The diode-connected transistor N0 limits the size of the amount of voltage drop ΔV to one conducting diode voltage drop, in this embodiment. Of course, another voltage drop limiting circuit may be employed that provides another limiting voltage drop value, as appropriate.

As noted previously, the separable conductive line (VDD wire) 325 may be substantially centrally located between the pair of complementary bit lines BL, BLB to balance the impact of coupling voltages from each of the pair of complementary bit lines BL, BLB. Additionally, a length of the separable conductive line (VDD wire) 325 is typically provided to be a same length as the pair of complementary bit lines BL, BLB. This additionally balances and maximizes the impact of coupling voltages from each of the pair of complementary bit lines BL, BLB. Although this construction may be typical of one embodiment, a location and a length of the separable conductive line (VDD wire) 325 may assume other configurations as dictated by a particular application. Additionally, the separable conductive line (VDD wire) 325 may perform as a virtual ground for shielding between the pair of bit lines BL, BLB when it is connected to the memory supply voltage VDD (i.e., not during the write operation).

For deep sub-micrometer technology, the distance between metals can be small, which generally increases the first and second coupling capacitances $C_{C1}$, $C_{C2}$. Correspondingly, as device size shrinks, a distributed capacitance associated with the device typically decreases thereby generally reducing the total ground capacitance $C_{tot}$. These two effects can provide an increase in a value of the voltage difference ΔV, thereby allowing a more aggressive reduction of the collapsible SRAM supply voltage VDD_RAM on the separable conductive line (VDD wire) 325, as may be required during the write operation.

Figure 4:
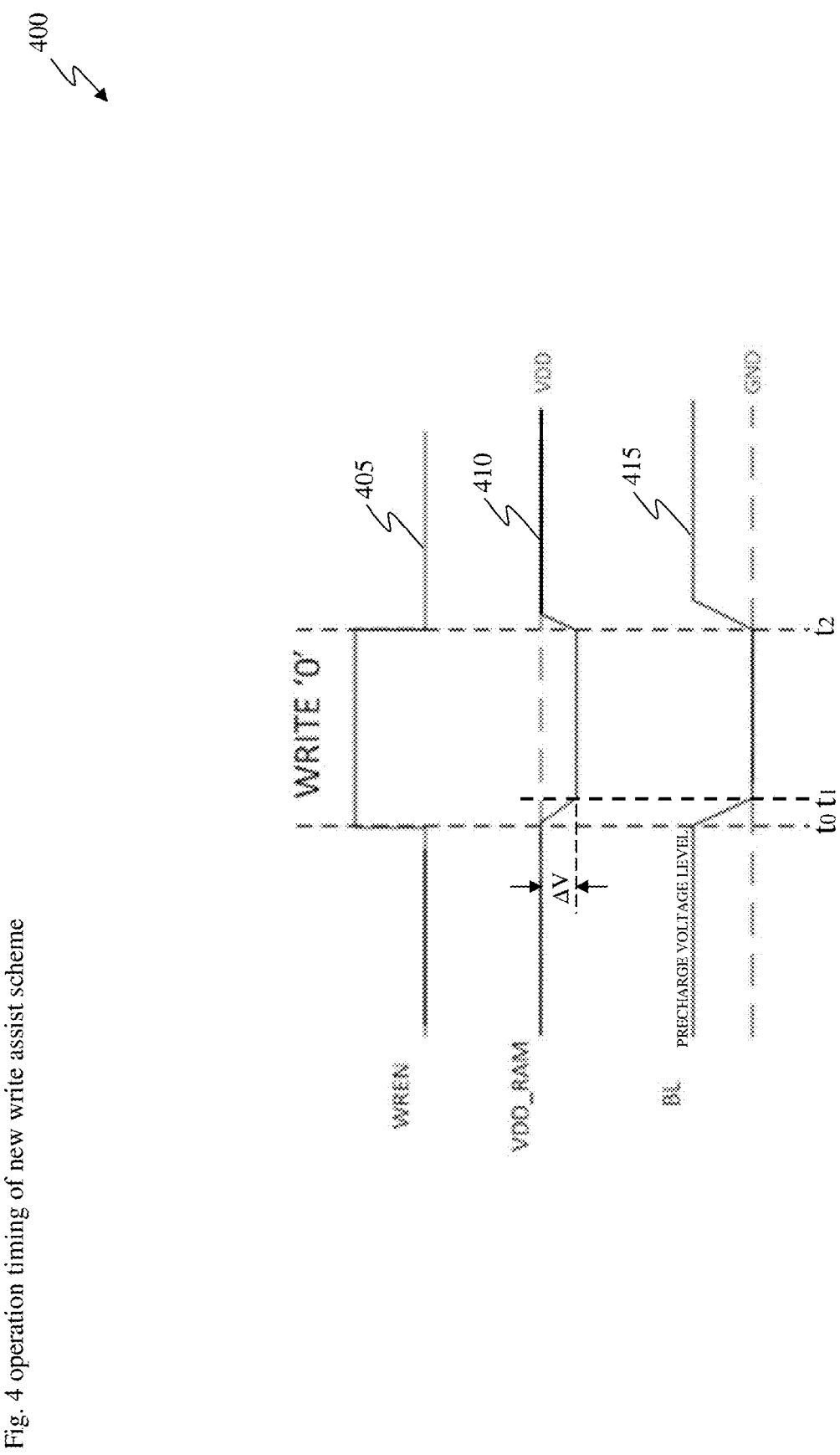
FIG. 4 illustrates write operation waveforms of an SRAM cell write operation corresponding to principles of the present disclosure.

FIG. 4 illustrates write operation waveforms of an SRAM cell write operation, generally designated 400, corresponding to principles of the present disclosure. The write operation waveforms 400 include a write enable control signal (WREN) 405, a collapsible SRAM supply voltage (VDD_RAM) 410 and a bit line (BL) voltage 415.

The write enable control signal (WREN) 405 is activated at a time to as shown. This action disconnects the collapsible SRAM supply voltage (VDD_RAM) 410 from an array supply voltage (VDD). This action also drives the bit line (BL) voltage 415 (in this example) from a precharge voltage level to a ground potential at a time $t_1$. This change in bit line voltage is capacitively coupled from the bit line (BL) voltage 415 to the collapsible SRAM supply voltage (VDD_RAM) 410 as a voltage difference ΔV, as shown. The reduction in the collapsible SRAM supply voltage (VDD_RAM) 410 is substantially maintained throughout the SRAM cell write operation thereby facilitating writing into the SRAM cell. Deactivation of the write enable control signal (WREN) 405 at time $t_2$ ends the write operation, where the collapsible SRAM supply voltage (VDD_RAM) 410 returns to the array supply voltage (VDD) and the bit line (BL) voltage 415 returns to its precharge voltage level.

Figure 5:
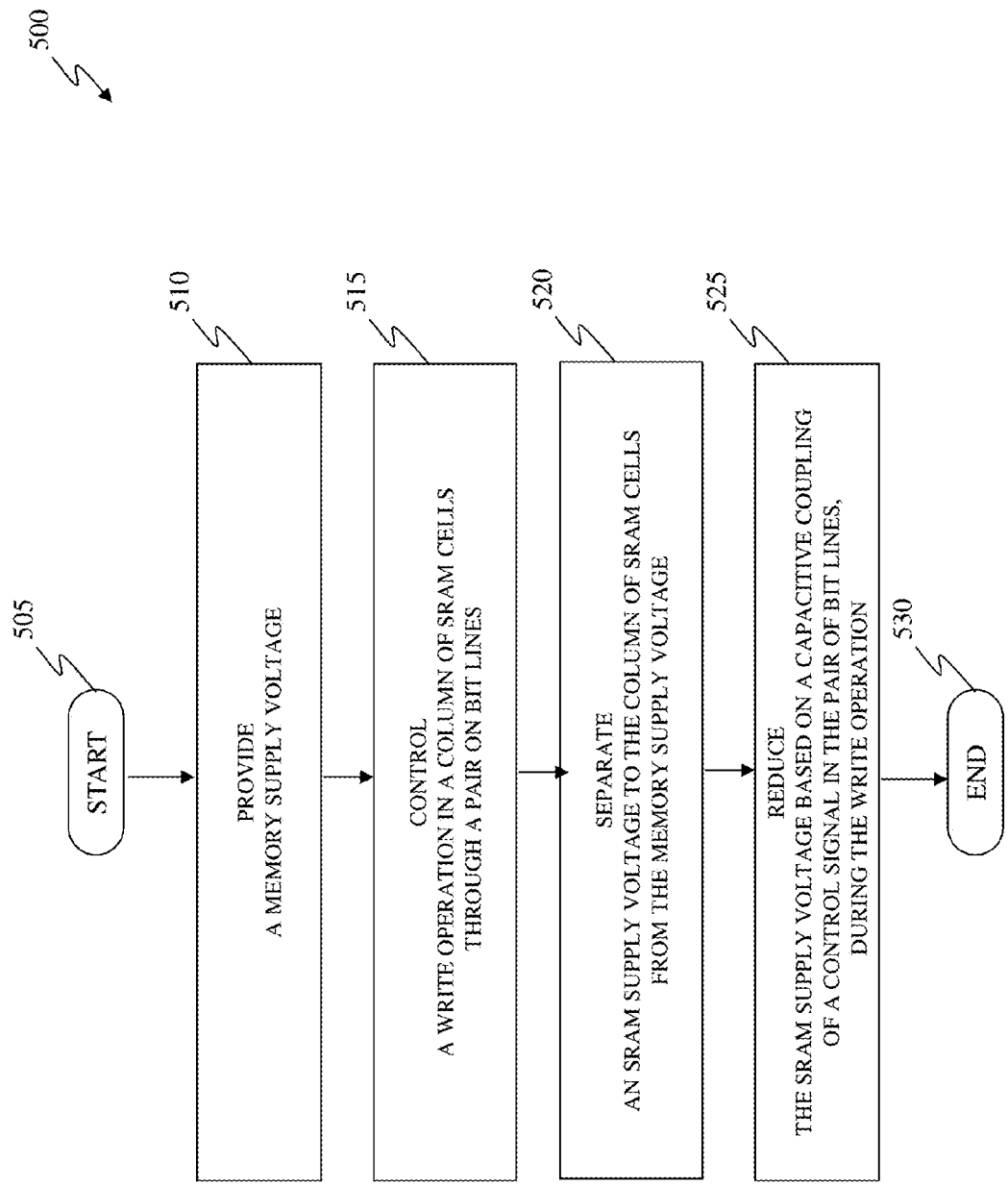
FIG. 5 illustrates a flow diagram of an embodiment of a method of operating a write-assist memory carried out according to the principles of the present disclosure.

FIG. 5 illustrates a flow diagram of an embodiment of a method of operating a write-assist memory, generally designated 500, carried out according to the principles of the present disclosure. The method 500 starts in a step 505, and in a step 510, a memory supply voltage is provided. Then, a write operation in a column of SRAM cells is controlled through a pair of bit lines, in a step 515. An SRAM supply voltage to the column of SRAM cells is separated from the memory supply voltage, in a step 520. And, in a step 525, the SRAM supply voltage is reduced based on a capacitive coupling of a control signal in the pair of bit lines, during the write operation.

In one embodiment, separating the SRAM supply voltage includes using a separable metal conductor centrally located between the pair of bit lines. Correspondingly, separating the SRAM supply voltage includes disconnecting the separable metal conductor from the memory supply voltage during the write operation. Additionally, disconnecting the separable metal conductor is controlled by a write enable signal that corresponds to the write operation. In another embodiment, the separable metal conductor is used as an electric shield between the pair of bit lines during standby or read operations. In yet another embodiment, the separable metal conductor is a same height as the pair of bit lines.

In still another embodiment, reducing the SRAM supply voltage includes a voltage limiting that provides a voltage reduction limit of the SRAM supply voltage. In one case, the voltage limiting is provided by a diode or a diode-connected transistor. Generally, the voltage reduction limit is less than or equal to a voltage required to provide proper operation of the column of SRAM cells. In yet another embodiment, a magnitude of the collapsible SRAM supply voltage is independent of a position of the column of SRAM cells in an SRAM array. The method 500 ends in a step 530.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

In summary, embodiments of the present disclosure provide improvements and advantages that include:

1) The write-assist scheme presented can be used to improve the write ability of SRAM cells by lowering the supply voltage of an SRAM cell, which is especially important for SRAM cells employing lower supply voltages.

2) The write-assist scheme presented can be scaled with required SRAM array size, such as complier applications.

3) The write-assist scheme presented is cost efficient and may be realized by adding only two transistors for every SRAM column.

4) The write-assist scheme presented can be controlled by an existing write enable control signal (WREN), relieving the need to introduce other control signals.

5) The write-assist scheme presented limits a maximum cell supply voltage drop, which can prevent SRAM cell storage data loss and improve overall reliability.

6) The write-assist scheme presented ensures that the read static noise margin (RSNM) of an SRAM cell located in another unselected column is not affected by a write operation.

7) The write-assist scheme presented ensures that a voltage drop margin of the collapsible SRAM supply voltage (VDD_RAM) is not affected by physical location in an SRAM array.

Those skilled in the art to which this application relates will appreciate that other and further additions, deletions, substitutions and modifications may be made to the described embodiments.

What is claimed is:

1. A write-assist memory having a write enable control signal that corresponds to a write operation, comprising:
   a memory supply voltage;
   a column of SRAM cells that is controlled by a pair of bit lines and a column selector, which is controlled by the write enable control signal; and
   a write-assist unit that is coupled to the memory supply voltage and the column of SRAM cells and has a separable conductive line that is coupled to the memory supply voltage by a supply voltage switch that is controlled by the write enable control signal, is located between the pair of bit lines, and provides a collapsible SRAM supply voltage to the column of SRAM cells based on a capacitive coupling between one of the pair of bit lines and the separable conductive line during a write operation.

2. The memory as recited in claim 1 wherein the separable conductive line is centrally located between the pair of bit lines.

3. The memory as recited in claim 1 wherein the supply voltage switch disconnects the separable conductive line from the memory supply voltage during the write operation.

4. The memory as recited in claim 1 wherein the write-assist unit further includes a voltage limiting circuit that provides a voltage reduction limit of the collapsible SRAM supply voltage.

5. The memory as recited in claim 4 wherein the voltage limiting circuit is a diode or a diode-connected transistor.

6. The memory as recited in claim 4 wherein the voltage reduction limit is less than or equal to a voltage required to provide proper operation of the column of SRAM cells.

7. The memory as recited in claim 1 wherein the separable conductive line is employed as an electric shield between the pair of bit lines during standby or read operations.

8. The memory as recited in claim 1 wherein the separable conductive line is a same height as the pair of bit lines.

9. The memory as recited in claim 1 wherein a magnitude of the collapsible SRAM supply voltage is independent of a position of the column of SRAM cells in an SRAM array.

10. A method of operating a write-assist memory having a write enable control signal that corresponds to a write operation, the method comprising:
providing a memory supply voltage;
controlling the write operation in a column of SRAM cells through a pair of bit lines and a column selector that is controlled by the write enable control signal;
separating, during the write operation, the memory supply voltage from an SRAM supply voltage provided to the column of SRAM cells via a separable metal conductor, wherein said separating is controlled by the write enable control signal; and
reducing the SRAM supply voltage based on a capacitive coupling between one of the pair of bit lines and the separable metal conductor during the write operation.

11. The method as recited in claim 10 wherein the separable metal conductor is centrally located between the pair of bit lines.

12. The method as recited in claim 11 wherein separating the SRAM supply voltage includes disconnecting the separable metal conductor from the memory supply voltage during the write operation.

13. The method as recited in claim 12 wherein disconnecting the separable metal conductor is controlled by the write enable signal.

14. The method as recited in claim 11 wherein the separable metal conductor is used as an electric shield between the pair of bit lines during standby or read operations.

15. The method as recited in claim 11 wherein the separable metal conductor is a same height as the pair of bit lines.

16. The method as recited in claim 10 wherein reducing the SRAM supply voltage includes limiting a voltage reduction of the SRAM supply voltage according to a voltage reduction limit.

17. The method as recited in claim 16 wherein the limiting of the voltage reduction is provided by a diode or a diode-connected transistor.

18. The method as recited in claim 16 wherein the voltage reduction limit is less than or equal to a voltage required to provide proper operation of the column of SRAM cells.

19. The method as recited in claim 10 wherein a magnitude of the SRAM supply voltage is independent of a position of the column of SRAM cells in an SRAM array.

* * * * *

UNITED STATES PATENT AND TRADEMARK OFFICE
CERTIFICATE OF CORRECTION

| | | |
|---|---|---|
| PATENT NO. | : 9,640,249 B2 | Page 1 of 1 |
| APPLICATION NO. | : 14/282809 | |
| DATED | : May 2, 2017 | |
| INVENTOR(S) | : Gang Chen, Jing Guo and Jun Yang | |

It is certified that error appears in the above-identified patent and that said Letters Patent is hereby corrected as shown below:

In the Specification

In Column 4, Line 39, after "transistor" delete "NO" and insert --N0--

In Column 5, Line 13, after "time" delete "to" and insert --$t_0$--

Signed and Sealed this
Fifth Day of December, 2017

Joseph Matal
*Performing the Functions and Duties of the*
*Under Secretary of Commerce for Intellectual Property and*
*Director of the United States Patent and Trademark Office*